United States Patent
Cole et al.

(10) Patent No.: US 6,759,683 B1
(45) Date of Patent: Jul. 6, 2004

(54) FORMULATION AND FABRICATION OF AN IMPROVED NI BASED COMPOSITE OHMIC CONTACT TO N-SIC FOR HIGH TEMPERATURE AND HIGH POWER DEVICE APPLICATIONS

(75) Inventors: Melanie W. Cole, Churchville, MD (US); Pooran C. Joshi, Vancouver, WA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 09/939,420

(22) Filed: Aug. 27, 2001

(51) Int. Cl.[7] .......................................... H01L 31/0312
(52) U.S. Cl. ...................... 257/77; 257/198; 257/743; 257/750; 257/757; 257/763; 257/764; 257/766; 257/770; 438/597; 438/285
(58) Field of Search .................... 438/597, 285, 438/630, 642, 648, 649, 650, 651, 658; 257/77, 198, 743, 750, 757, 763, 764, 766, 770

(56) References Cited

U.S. PATENT DOCUMENTS 5,597,744 A * 1/1997 Kamiyama et al. .......... 438/285
5,929,523 A * 7/1999 Parsons ....................... 257/750
6,110,813 A * 8/2000 Otta et al. ..................... 257/77
6,468,890 B2 * 10/2002 Bartsch et al. .............. 438/597

* cited by examiner

Primary Examiner—Matthew Smith
Assistant Examiner—B V Keshavan
(74) Attorney, Agent, or Firm—William Randolph

(57) ABSTRACT

A composite Pt/Ti/WSi/Ni Ohmic contact has been fabricated by a physical deposition process which uses electron beam evaporation and dc-sputter deposition. The Ni based composite Ohmic contact on n-SiC is rapid thermally annealed (RTA) at 950° C. to 1000° C. for 30s to provide excellent current-voltage characteristics, an abrupt, void free contact-SiC interface, retention of the as-deposited contact layer width, smooth surface morphology and an absence of residual carbon within the contact layer and/or at the Ohmic contact-SiC interface. The annealed produced $Ni_2Si$ interfacial phase is responsible for the superior electrical integrity of the Ohmic contact to n-SiC. The effects of contact delamination due to stress associated with interfacial voiding has been eliminated. Wire bonding failure, non-uniform current flow and SiC polytype alteration due to extreme surface roughness have also been abolished. The Ohmic contact also avoids electrical instability associated with carbon inclusions within the contact metallization and/or at the contact-SiC interface, that occur under prolonged high temperature and power device operations. Overall, this contact is reliable for high temperature and high power operations and the stresses inclusive of use under those conditions.

6 Claims, 12 Drawing Sheets

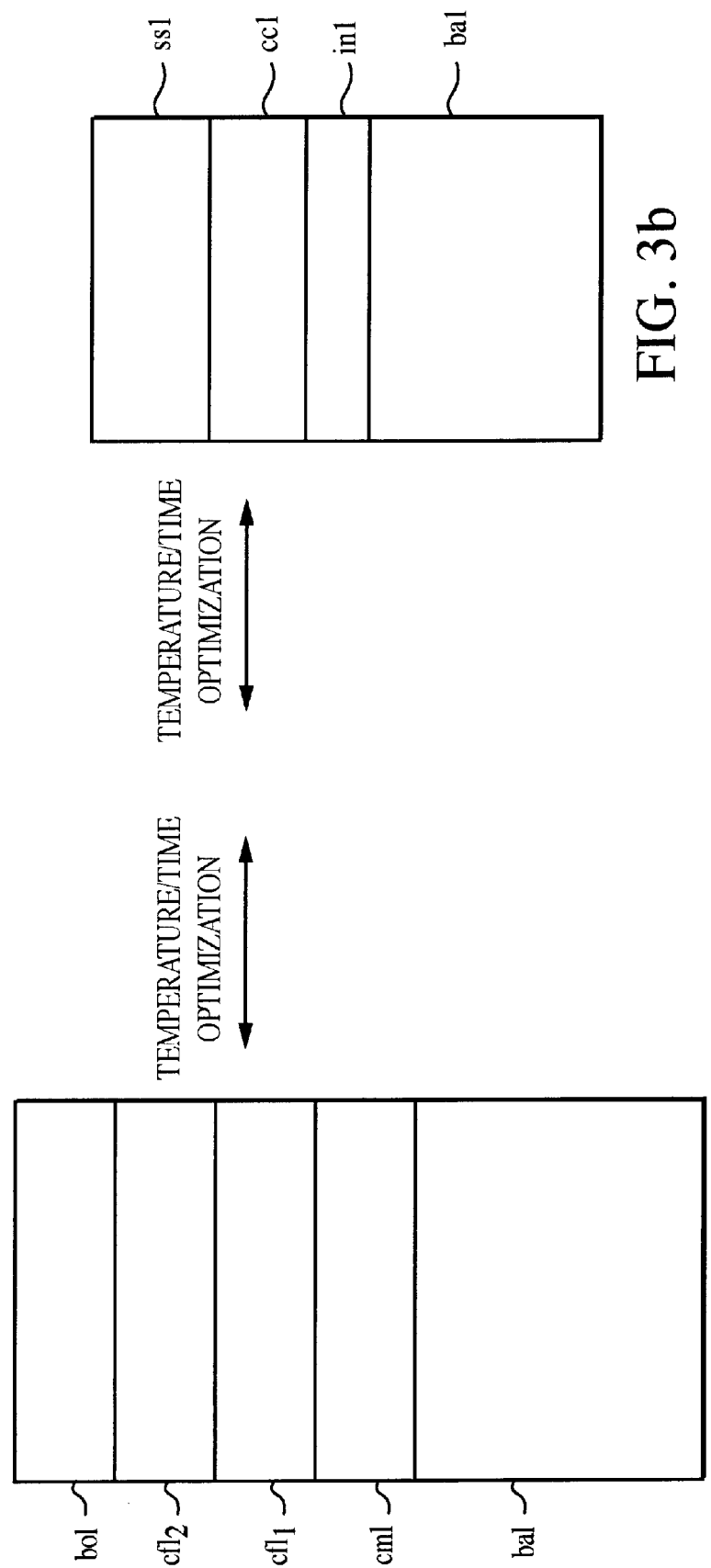

FORMULATION AND FABRICATION OF AN IMPROVED NI BASED COMPOSITE OHMIC CONTACT TO N-SIC FOR HIGH TEMPERATURE AND HIGH POWER DEVICE APPLICATIONS

STATEMENT OF GOVERNMENT INTEREST

The invention described herein is the property of the United States Government as represented by the Secretary of the Army, US Army Materiel Command.

BACKGROUND OF THE INVENTION

1. Filed of the Invention

This invention is directed to a semiconductor device manufacturing process. This invention is also directed to a metallization scheme and fabrication process for forming an Ohmic contact on a wide bandgap semiconductor material. This invention is further directed to a metallization scheme and fabrication process for forming a low resistance, thermally stable Ohmic contact on n-type silicon carbide (SiC) using the post-deposition annealed (950° C.–1000° C.) composite metallization scheme Platinum/Titanium/Tungsten silicide/Nickel (Pt/Ti/WSi/Ni).

2. Discussion of Relevant Arts

Silicon carbide (SiC) is an excellent candidate for high temperature and high power device applications because of its combination of electronic and thermal properties, namely, wide energy bandgap, high electric breakdown field, large saturated electron drift velocity and high thermal conductivity (See Philip G. Neudeck, J of Electronic Materials 24, 283 (1995); S. J. Pearton et al, Electrochemical Society Proc. 97-1,138(1997); M. R. Melloch et al., MRS Bulletin 23, 42 (1997); T. P. Chow et al, IEEE Trans. Electron Devices 41,1481 (1994); and T. P. Chow et al., Mat. Res. Soc. Proc. 423, 9 (1996)).

Based on these properties, devices fabricated from SiC deliver superior performance over existing devices. Rapid advances in the growth, doping and processing of SiC have led to the realization of several electronic and photonic devices including fast recovery high voltage diodes, MOSFETs, MESFETs, SITs, JFETs, UV photodiodes, SiC bipolar devices, BJTs and HBTs. The wide bandgap and high thermal conductivity are attractive for high temperature digital integrated circuits and nonvolatile solid-state memories. Although progress with SiC based electronic devices has been encouraging, there are significant challenges to overcome. This is particularly relevant in the areas of physical and chemical development, electrical stability and reliable multilevel metallization technology capable of high packing density.

An important requirement of all device technologies is the development of electrical contacts with low specific contact resistance and high stability and long term reliability. Ohmic contacts with low specific contact resistance and good thermal stability are necessary to obtain optimum performance from high temperature, high power, and high frequency devices.

As the device dimensions continue to decrease, much more stringent requirements are being placed on the material, processing and electrical performance of low resistance Ohmic contacts. Metallization of wide bandgap semiconductors (SiC) is complicated, particularly because of their high surface reactivity, low doping concentrations, and high density of interface states. Most SiC based electronic devices which cannot sustain long-term operation at an elevated temperature/power level suffer deterioration of their metal/SiC contacts (See L. M. Porter et al., Mat. Sci. and Eng. B34, 83 (1995)). Thus, an important concern in the development of SiC devices is the formation of low resistance Ohmic contacts with good thermal, chemical and mechanical stability.

To date, many metallizations, namely Ni, Al/Ni/Al, Cr, Al, Au—Ta, $TaSi_2$, W, Ta, Ti, TiW, TiC, Ti/Au, $TiSi_2$, Co, Hf, Re, and WSi have been investigated for Ohmic contacts to n-SiC (See J. Crofton et al, Phys. Stat. Sol. 202, 581 (1997); and M. W. Cole et al., Electrochemical Society Proc. 28, 71 (1998)). Industry standards have deemed Nickel Ohmic contacts to be the preferred standard contacts for SiC devices. Nickel Ohmic contacts to n-SiC possess a low specific contact resistance ($p_c$) less than $5.0 \times 10^{-6}$ $\Omega$-$cm^2$, and good physical thermal stability at temperatures up to 500° C. for ~100 h. In addition, from the point of electrical integrity, nickel Ohmic contacts to n-SiC are reproducible (See Crofton above; See also Crofton et al., J. Appl. Phys. 77,1317 (1995); Crofton et al., Proc. Of the Fourth Int'l. High Temperature Electronics Conference, 4, 84 (1998); Marinova et al., Materials Science and Engineering B46, 223 (1997)).

Ni-nSiC Ohmic contacts are known to be formed by depositing pure metallic nickel on the n-SiC substrate. This intermediate (Ni—SiC) is then furnace annealed at temperatures of about 950° C. for 2 to 5 min or rapid thermal annealed (RTA) at temperatures of about 950 to 1000° C. for 30 to 60 seconds. Annealing results in the formation of the intermetallic phase Ni-silicide ($N_2Si$) overlying the SiC substrate material (See Crofton et al, Phys. Stat. Sol., 202; Crofton et al., J. Appl. Phys., 77; Crofton et al., Proc. Of the Fourth Int'l High Temperature Electronics Conference, 4; and Marinova et al., Materials Science and Engineering B46, above; see also Luckowski et al, Mat. Res. Soc. Symp. Proc. 423, 119 (1996); Adams et al., Proc. Of the Second Int'l High Temperature Electronics Conference, 2, 9 (1994); Goesmann et al, Materials Science and Engineering B46, 357 (1997); Porter et al., Mater. Res. 10, 668 (1995); and Waldrop et al., Appl. Phys. Lett. 62, 2685 (1993)).

The resulting Ohmic contact composition is represented by the chemical formula $Ni_2Si$—SiC. Forming $Ni_2Si$ by annealing Ni—SiC at 950 to 1000° C. has been reported to cause a lower resistance of the initial Ni—SiC contact. Therefore, it is actually this $Ni_2Si$—SiC composition and not pure Ni intermediate contact that displays the low specific contact resistance reported above.

The high temperature annealing process used to form these $Ni_2Si$—SiC Ohmic contacts have resulted in several undesirable features which cause device unreliability and ultimate device failure (See Crofton et al., Phys. Stat. Sol., 202; Crofton et al., Proc. Of the Fourth Int'l. High Temperature Electronics Conference, 4; and Marinova et al., Materials Science and Engineering B46, above; see also Getto et al, Material Science and Engineering B61–62, 270 (1999)).

The undesirable features of these $Ni_2Si$—SiC Ohmic contacts include:

1. Substantial broadening of the contact layer thickness or metal-SiC interface expansion. The increase in contact thickness via consumption of the SiC substrate is due to the high reactivity of Ni with Si to form Ni-silicide leaving behind both voids and unreacted carbon. Annealing the Ni—SiC contact results in a contact thickness increase of $\geq 100\%$. Such an increase in contact thickness makes the annealed Ni—SiC Ohmic contact incompatible for device designs which possess shallow p-n junctions.

2. A rough interface morphology heavily laden with Kirdendall voids. The voids resulting from the high reactivity of Ni with Si at the interface will cause internal stress and possible delamination of the contact layer, which will compromise device reliability. The internal stress and contact delamination will be significantly amplified under the extreme thermal and electrical stresses typical of the power device operational environment and will ultimately result in device failure. The rough interface morphology makes the annealed Ni—SiC Ohmic contact unsuitable for device designs which possess shallow p-n junctions. Thus loss of a sharp interface will compromise device designs which posses shallow p-n junctions.

3. Carbon segregation at the metal SiC interface and/or throughout the metal layer. Though x-ray photoelectron spectroscopy (XPS) analysis of the annealed contact, it is known that carbon is in the graphite state and that Si is bonded predominantly to Ni resulting in Ni-Silicide formation. Dissociation of SiC to Si and C in the presence of Ni atoms is possible at temperatures above 400° C. Thus the dissociation of SiC at the Ni/SiC interface to Si and C is due to the reactivity of Ni. Carbon inclusions at the metal-SiC interface and/or within the contact layer are considered a potential source of electrical instability, especially after prolonged operation of the devices at high temperatures. At elevated temperatures, redistribution of carbon inclusion occurs, resulting in significant degradation of the contact's electrical and microstructural properties.

4. Substantial roughening of the contact surface (on the order of tens of nanometers). For many device applications, Ohmic contacts must be wire bonded to a die package. A rough surface morphology will most likely cause wire bonding difficulty and/or failure under the extreme thermal fatigue during high power and high temperature device operation. Additionally, rough surface morphology is not desirable for high current applications because it causes non-uniformity of current flow. In addition, contact surface roughness results in residual material stresses that may induce SiC polytype changes. Alteration of the SiC polytype also alters the electrical properties. For example, a polytype change from 4H to 6H degrades the electron mobility of the SiC and degrades the device.

Therefore, even through Ni contacts possess excellent electrical properties, the above mentioned features will lead to device reliability problems and ultimately cause device failure via contact degradation and/or wire bond failure after exposure to long term high power and high temperature device operational stresses.

SUMMARY OF THE INVENTION

This invention overcomes disadvantages of prior Ohmic contact metallization schemes to n-siC substrates by providing an Ohmic contact metallization scheme having excellent electrical properties, a narrow $Ni_2Si$ interfacial reaction zone, smooth surface morphology, minimal contact broadening and a smooth, abrupt and void free contact-SiC interface.

The structure of the Ohmic contact metallization scheme provides that the residual carbon, resultant from the reaction of SiC with the overlying Ni, is confined by Ti-carbide and W-carbide phases spatially distant from the contact-SiC interface. Thus, the detrimental effects of contact delamination due to stress associated with interfacial voiding, and wire bond failure due to extreme surface roughness, have been eliminated for this composite Ohmic contact.

This overcomes problems faced by prior art Ohmic contacts in SiC devices, such as the detrimental effects of contact delamination due to stress associated with interfacial voiding, and wire bond failure due to extreme surface roughness.

This invention also eliminates electrical instability associated with carbon inclusions at the contact-SiC interface after prolonged high temperature and high power device operations. Thus, this invention overcomes the difficulties faced in prior art Ohmic contacts to n-SiC which are subject to high temperature and high power operational stresses.

It is, therefore, an object of this invention to provide a low resistance, high temperature stable and high power stress stable physical vapor deposited Pt/Ti/WSi/Ni Ohmic contact to n-SiC.

It is also an object of this invention to provide a Ni based composite Ohmic contact metallization scheme on n-SiC, where the Ohmic contact is formed on n-type silicon carbide substrate.

It is also an object of this invention to provide an Ohmic contact to n-SiC by means of an e-beam evaporation and dc-sputtering deposition process followed by post-deposition rapid thermal annealing.

BRIEF DESCRIPTION OF THE DRAWINGS

FIG. 3(a) shows a schematic of the as deposited Pt/Ti/WSi/Ni composite Ohmic contact to n-SiC metallization scheme of the present invention.

FIG. 3(b) shows a schematic of the annealed Pt/Ti/WSi/Ni composite Ohmic contact to n-SiC metallization scheme of the present invention.

DETAILED DESCRIPTION OF THE EMBODIMENTS

Figure 1B:
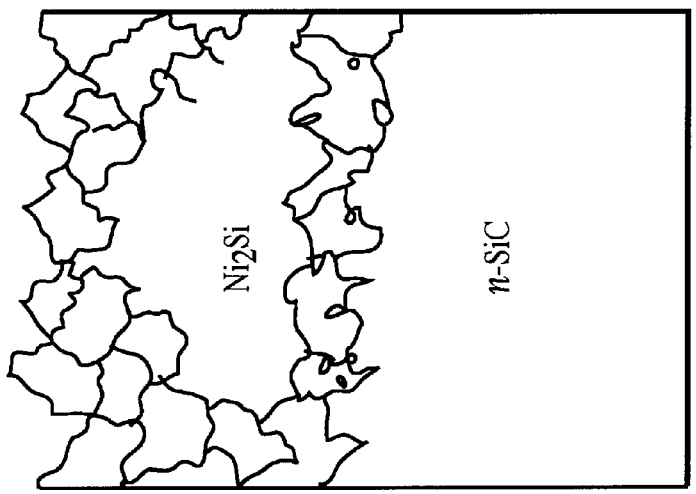
FIG. 1(b) shows a schematic representation of the prior art, annealed at 950° C., pure Ni Ohmic contact to n-SiC.
Figure 1A:
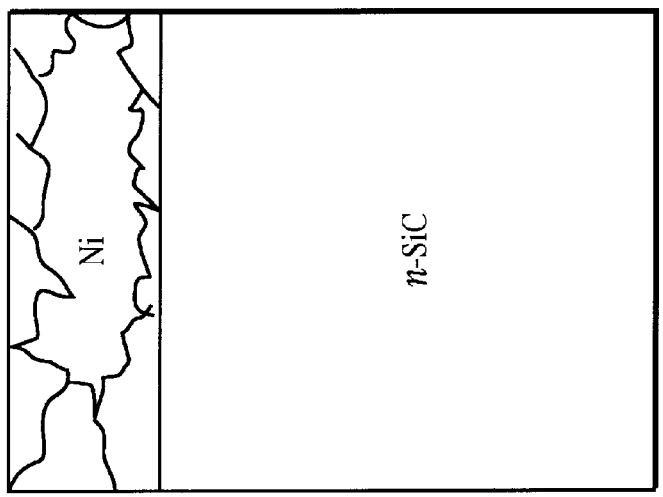
FIG. 1(a) shows a schematic representation of the prior art, as deposited, pure Ni Ohmic contact to n-SiC.

The present invention overcomes undesirable phenomena associated with annealed pure Ni-nSiC Ohmic contacts. FIGS. 1(a) and 1(b) show schematic representations of prior art pure Ni Ohmic contacts to n-SiC. FIG. 1(a) shows the as deposited Ni-nSiC and FIG. 1(b) shows the Ni-nSiC Ohmic contact, annealed at 950° C. to form. These contacts are plagued with problems including a rough surface, the presence of unreacted carbon, a broad, non-abrupt interface layer and the presence of Kiirdendall voids.

The present invention successfully addresses the disadvantages of the prior art by limiting the interfacial reaction, tying up unreacted carbon, limiting contact thickness increase and eliminating voids and surface roughness while maintaining electrical integrity.

All semiconductor devices require high quality, low resistivity thermally stable reliable n- and p-type Ohmic contacts. Ohmic contacts are essential for the transfer of signals between the SiC device and external circuitry. The metallization design and the selection and method of deposition heavily influence the electrical and physical properties of the Ohmic contacts of all semiconductors. While there are several metallization designs, the most commonly used SiC device technology utilizes a single layer, bilayer, multilayer composite metallization schemes and compound intermetallics.

Low resistance Ohmic contacts to n-type SiC can be obtained by depositing metallizations with appropriate work functions to achieve a barrier height reduction at the metal-SiC interface. The barrier heights of various contacts depend on the surface properties and electron affinity of the semiconductor, and the work function of the metal.

For SiC, barrier heights do not follow the Schottky Mott theory and are typically constrained to high values. In practice, the degree of dependence of barrier height on choice of metal has been determined to be dependent on the bulk semiconductor properties, the nature of the surface before contact formation and the interfacial chemistry. At practical SiC interfaces, interface states cause Fermi level pinning which results in the formation of a potential barrier. The interface states affect the charge transfer between the metal and the SiC, thus controlling the Schottky barrier height.

Metal deposition can be achieved by various methods. The most common of these include electron-beam (e-beam) evaporation, sputtering and thermal evaporation. Sputtering and e-beam evaporation are preferred over thermal evaporation for Ohmic contact metal deposition because they produce large area uniform films. E-beam evaporated metal films have less gas incorporation in the condensed films than sputtered metal films and possess higher levels of film purity. Sputtered films, however, have better film-substrate adhesion since the condensing atoms have higher energies in comparison to e-beam deposited films. The choice of metal determines which deposition method is preferred, with refractory metals best suited to sputter deposition. Additionally, equipment availability factors heavily upon deposition methods chosen.

Thermal evaporation methods are less desirable because they involve a resistance-heated source (refractory metal coiled into a filament) or an evaporation source that is heated by rf induction, utilizing a BN crucible, which results in contamination of the charge from the heater or crucible. This contamination leads to unwanted impurities which adversely affect the electrical properties of the condensed Ohmic contact metal film. The method of metal deposition heavily influences the grain size, uniformity, and metal-epilayer interface properties of the condensed contact film. Grain boundaries serve as diffusion pathways. Thus, minimizing grain boundaries controls unwanted elemental diffusion.

For the same metal deposited by sputtering and e-beam evaporation, the e-beam evaporated films. possess a much larger grain size which translates to less grain boundary area and lower diffusion pathways. Additionally, larger grain metal films possess higher hardness vales which influence the overall mechanical durability of the metal film.

Post metal deposition annealing is usually required to achieve Ohmic behavior in the deposited metal films on SiC. SiC-metal contact annealing is achieved through conventional furnace annealing (CFA) and rapid thermal annealing (RTA) . The choice of ambient annealing gas significantly influences the electrical properties of Ohmic contacts. For CFA, ambient atmosphere ranges from vacuum annealing (where potential metal oxidation may be an issue), to flowing $N_2$, Ar, and forming gas. The most common RTA ambient gasses are $N_2$, Ar and forming gas. CFA requires greater processing times in comparison to RTA and thus often enhances unwanted elemental diffusion.

For some contact metals to SiC, the thermally induced interfacial reactions which are responsible for Ohmic behavior demand narrow time-temperature process windows, thus favoring rapid thermal processing. Specifically, RTA is a fast thermal processing method, 1–100 sec which provides the advantages of (a) reduced thermal budget (anneal temperature multiplied by the anneal time), and (b) rapid heating and cooling rates in the range of 30–500° C./sec. These advantages are critical to the formation of good Ohmic contacts since the desired interfacial phase formation usually occurs at some temperature ($T_1$) for a time ($t_1$), after which the processing temperature can be reduced rapidly by as much as 50° C. in 1 sec. Thus, undesired contact metal-SiC phase formation/phenomena having different activation energy than the desired contact metal-SiC phase formation are almost completely suppressed since only a fraction of a second would be available for the undesirable process or phase formation. The most common annealing method for SiC contact technology is RTA, but again, like metal deposition methods, the annealing mode is often a function of equipment availability.

Optimum contact performance is not only influenced by the material processing and design elements described above, but also relies on strict adherence to a set of fundamental contact-semiconductor requirements. Currently, there are several critical requirements for Ohmic contacts which must be satisfied in order to achieve high performance reliable SiC based devices. The most prominent of these is the ability to attain a reproducible low specific contact resistance value. Additionally, the Ohmic contact must not significantly perturb device performance. That is, the contact must supply the required current density with a voltage drop that is significantly small compared with the drop across the active region of the device.

The contact must also possess good mechanical properties, particularly, good metal adhesion during formation, subsequent processing and in service device operation. The metallization must not cause excessive stress in the underlying semiconductor since this can result in alteration of electronic characteristics The Ohmic contact must be temporally and thermally stable. The Ohmic contact must also be environmentally stable under prolonged bias-temperature stress, humidity, and reactive ambient conditions. The contact metal-semiconductor interface must be uniform, shallow, and abrupt. In the case of alloyed contacts, the metal-semiconductor interface phase(s) must be laterally homogeneous. This uniformity of metal-semiconductor interfacial reactions serves to minimize the spread in contact resistance values, suppress current nonuniformity and improve device reliability. The metallization must have a smooth surface morphology, which is critical for device wire bonding.

Fabrication of the Ohmic contacts must be controllable and reproducible, that is, reactions and other properties. which govern the contact resistance must be reproducible and the contact fabrication must be compatible with semiconductor processing. Finally, the drive towards lower contact processing temperatures should be adhered whenever possible. This is critical for device integration issues, namely, integration of materials with differing thermal stability within a single device (heterostructures) and/or integration of several devices, composed of different materials, on a common substrate.

This invention, therefore, provides an improved Ohmic contact to n-SiC using e-beam evaporation and dc sputter deposition of a Ni based composite metallization scheme Platinum/Titanium/Tungstensilicide/Nickel (Pt/Ti/WSi/Ni) on n-type Silicon carbide (n-SiC) and having the dimensions of 100 nm:25 nm:80 nm:40 nm. Deposition is followed by a post deposition rapid thermal anneal at 950 to 1000° C. for 30 seconds.

The Pt/Ti/WSi/Ni composite metallization was e-beam evaporated and dc sputter deposited on research grade, Si-face 8° off-c-axis (0001) 4H n-type($8.0 \times 10^{18}$ cm$^{-3}$) SiC wafers. The SiC substrate was mounted in an e-beam evaporator chamber (preferred base pressure of ~$3.0 \times 10^{-8}$ Torr) in the substrate/sample position. The 40 nm Ni layer was then e-beam evaporated from a source nickel charge which was 99.9% pure. The sample was then removed and placed in a dc sputter deposition chamber (MRC 940 system) and the 80 nm thick WSi second layer was dc sputtered from a single composite target of composition WSi (5:3.9) at a power level of 500 watts and a pressure of 2 m Torr using an Argon sputter gas. The third and fourth layers, 25 nm Ti and 100 nm Pt, were sequentially e-beam evaporated from Ti and Pt source charges, respectively. Both source charges were 99.9% pure.

Prior to metal deposition, the wafers were cleaned in warm electronic grade trichoroethane (TCA), boiling acetone and methanol, followed by a rinse in deionized water. The samples were rapid thermally annealed (RTA) in a AG Associates rapid thermal annealing system for 30 seconds at 900, 950 and 1000° C. in a $N_2$ ambient environment. Material characterization was performed on the as-deposited and annealed samples. The contacts electrical quality was evaluated via current voltage characteristics using a HP 4140B semiconductor test system.

Auger electron spectroscopy (AES) was used to chemically depth profile the different contact elements. The AES data was acquired using a Perkin-Elmer PHI660 scanning Auger microscope. A 5 keV electron beam was used to stimulate Auger transitions within the sample. In addition, a 4 keV Ar$^+$ ion beam was used to simultaneously sputter-etch the surface. In this way, elemental information as a function of depth was collected, that is an Auger depth profile. The resulting data was plotted as atomic concentration versus sputter time, Field emission scanning electron microscopy (FESEM) was utilized to assess the contact surface morphology, contact-SiC interface uniformity, and film microstructure. Cross-sectional and plan-view images were acquired with a Hitachi S4500 FESEM. A 45° sample stub combined with the stage tilt (45° maximum) was employed for the cross-sectional imaging. The imaging was executed without conductive coatings in both secondary and back-scatter electron modes at magnifications ranging from 15 kx to 150 kx. The surface morphology was also examined and quantified by a Digital Instrument's dimension 3000 atomic force microscope (AFM) using tapping mode with amplitude modulation. The contact structure was analyzed by glancing-angle (5°) x-ray diffraction (GAXRD). The GAXRD patters were recorded on a Siemens D-5005 powder diffractometer using Cu K radiation at 50 kV and 40 MmA. Data was acquired in the range of 20 to 100° at a scan rate of 1.8° 2θ/min.

Thermal reliability of the optimized high temperature post-deposition annealed composite contact to n-SiC was evaluated via pulsed and static thermal testing. The pulsed thermal stability tests were conducted using a AG Associates RTA in a $N_2$ ambient, where the optimized Ohmic contact was exposed to 1, 10 and 100 cycle(s) of thermal pulses at a temperature of 650° C. Each pulse interval was 10 s and each pulse was followed by a 60s cooling interval. The contacts were evaluated via I-V measurements before and after thermal cycling. The static thermal stability tests were conducted in a tube furnace at a temperature of 650° C. in a flowing $N_2$ ambient for time intervals of 1 hr., 24 hrs., 50 hrs., 75 hrs., and 100 hrs. The contacts were evaluated via I-V measurements before and after static thermal stability testing.

Figure 2:
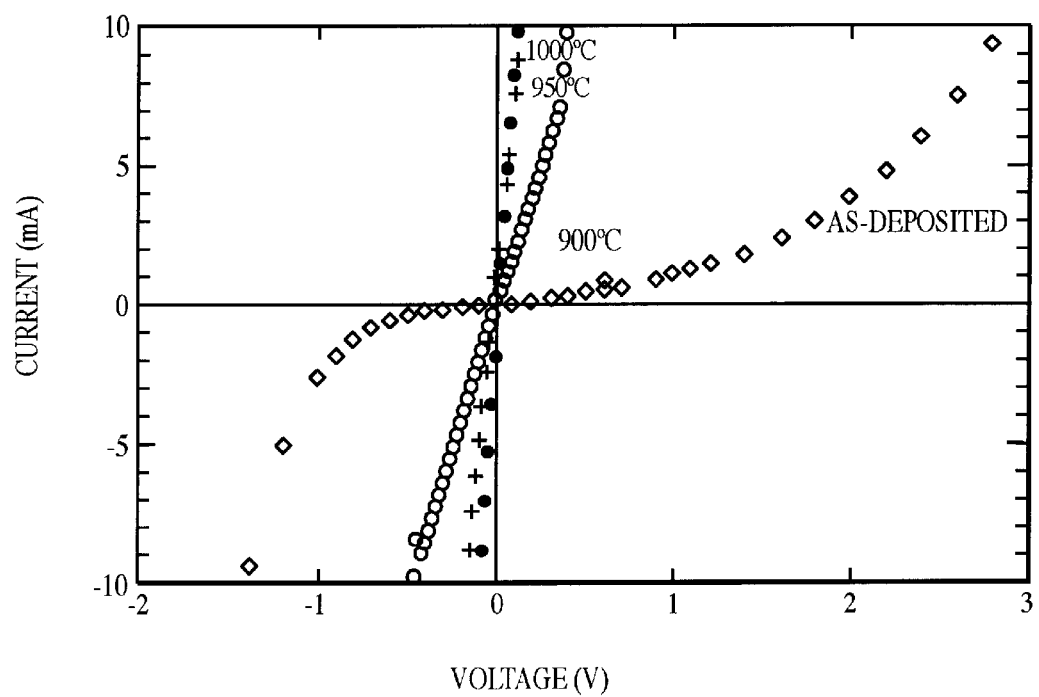
FIG. 2 shows I-V characteristics of the (i) as-deposited Pt/Ti/WSi/Ni Ohmic contacts to n-SiC, (ii) 900° C., (iii) 950° C., and (iv) 1000° C. annealed Pt/Ti/WSi/Ni Ohmic contacts to n-SiC.

FIG. 2 shows the I-V characteristics of the as-deposited (as represented by open diamonds), 900° C. (open circles), 950° C. (crosses), and 1000° C. (filled circles) annealed Pt/Ti/WSi/Ni Ohmic contacts to n-SiC. The as-deposited sample exhibited rectifying behavior, indicative of large barrier height, typically 1 eV or greater. Annealing at 900° C. caused the I-V characteristics to move toward Ohmic behavior. Ohmic behavior is demonstrated by I-V characteristics which possess linear characteristics with small resistance and are symmetric with reversal of voltage polarity. The contacts became fully Ohmic after the 950° C. anneal. A further reduction in resistance, and the best Ohmic behavior, was achieved after annealing at 1000° C. Thus, annealing at temperatures between 900° C. and 1000° C. significantly enhanced the current conduction through the contacts.

As shown in FIG. 3(a), the as-deposited metallization scheme of the Pt/Ti/WSi/Ni composite Ohmic contact includes a n-SiC substrate base layer (bal), with a Ni contact metal layer (cml) formed on top of the substrate layer. This cml layer is preferably 40 nm. A WSi carbide former layer ($cfl_1$) is formed on top of the contact metal layer. This ($cfl_1$) layer is preferably 80 nm. A Ti carbide former layer ($cfl_2$) is formed on top of the WSi carbide former layer, having a preferred thickness of 25 nm, and a Pt bond layer (bol) is formed on top of the WSi carbide former layer. The (bol) layer is preferred to have a depth of 100 nm. The preferred dimensions are discussed below. Note that each of the layers between each of the contact metallization, remains distinct.

As shown in FIG. 3(b), the annealed metallization scheme of the Pt/Ti/WSi/Ni composite Ohmic contact no longer provides distinct individual contact metal layers. As shown in this figure, the annealed contact includes at least four layers, with a n-SiC substrate layer (bal), a narrow $Ni_2Si$ layer (inl), a $W_{1-x}C_x$—$Ti_{1-x}C_x$ layer (ccl), and a stable surface zone layer (ssl), which is composed of several phases or alloys, including Pt, Ni, Si and W.

In order to assess and understand the contacts electrical characteristics AES elemental depth profiles, GAXRD, and field emission SEM microstructural analyses were performed on the as deposited and annealed samples. The AES depth profiles for the as-deposited and 1000° C. annealed samples are shown in FIGS. 4(a) and 4(b), respectively.

Figure 4A:
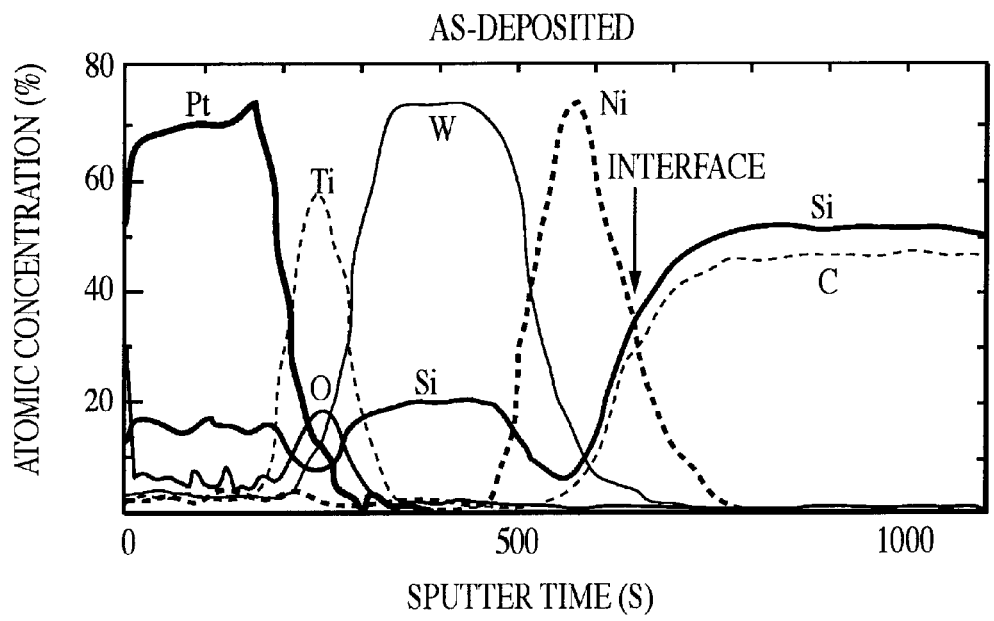
FIG. 4(a) shows an AES depth profile for the as-deposited Pt/Ti/WSi/Ni metallization scheme on n-SiC.

FIG. 4(a) shows an AES depth profile of the as deposited Pt/Ti/WSi/Ni composite contact that the top surface is composed of pure Pt. Underlying the Pt is a very well resolved Ti layer. The Ti layer shows signs of oxidation as evidenced by the oxygen signal peaking at ~18 at. % at a sputter time of 250 sec. The WSi and Ni layers are very distinct and show no evidence of mixing. The interface between Ni and SiC substrate is chemically abrupt, as there is no evidence of an interfacial oxide or interfacial chemical reactions upon sputter deposition.

Figure 4B:
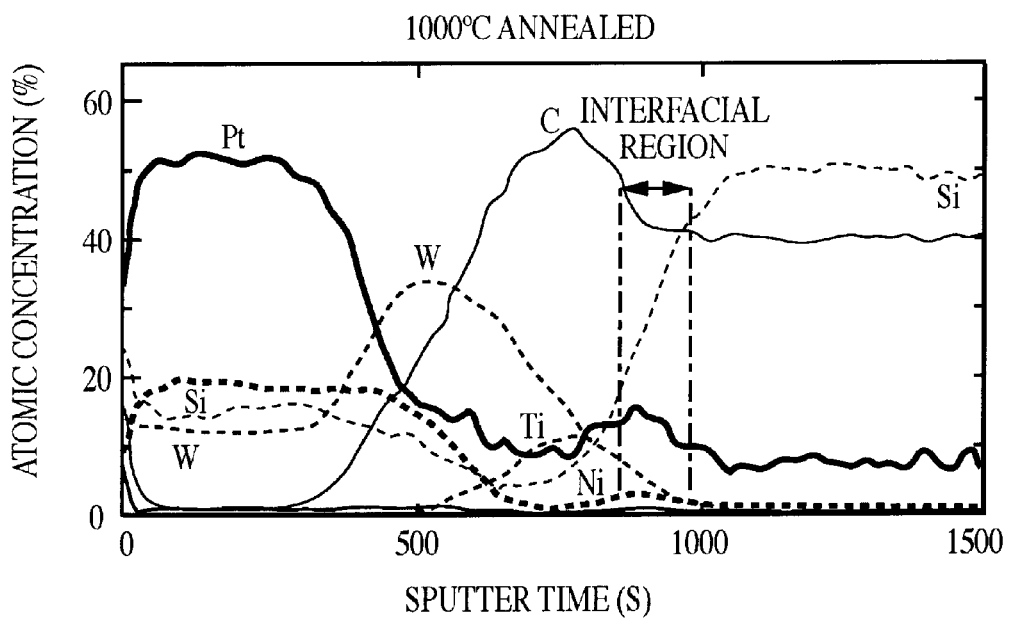
FIG. 4(b) shows an AES depth profile for the 1000° C. annealed Pt/Ti/WSi/Ni metallization scheme on n-SiC.

The AES depth profile of the 1000° C. annealed sample is shown in FIG. 4(b). The individual contact metal layers are no longer distinct. Extensive intermixing has occurred in response to the 1000° C. heat treatment. A minimum of four layers are present within the contact metallization. The top or outer most layer is dominated by Pt, Ni, Si and W signals and most likely includes several phases or alloys. Underlying the surface alloy zone is a layer predominately composed of predominately tungsten carbide. Beneath the tungsten-based layer is a region where the carbon signal displays a strong peak, 55 at. % at a sputter time of 750 seconds. The position of the carbon peak coincides with the maximum in the Ti signal and indicates titanium-carbide phase formation. The presence of TiC was confirmed by the GAXRD analysis.

The GAXRD analysis on the 1000° C. annealed sample revealed peaks at 41.7°, 60.45°, 72.35°, 90.8° two theta which correspond to 2.16 Å, 1.52 Å, 1.30 Å and 1.09 Å d-spacings for TiC. Further evidence for TiC formation is derived from Ti based contacts to SiC, where TiC was the stable phase above 700° C. The 20–80 at. % decay of the Si signal (in the AES depth profile), between 850s and 950s sputter time, defines the metal-SiC interfacial region. Within this designated interfacial region exists a peak in the Ni signal. This is evidence of a limited reaction region between Si and Ni resulting in $Ni_2Si$ phase formation at the metal-SiC interface. Within this same area is a Pt peak, which has been attributed to noise at the Pt energy level.

GAXRD data also supports the existence of the $Ni_2Si$ phase. The GAXRD analysis detected peaks at 31.24°, 32.78°, 33.4°, 39.5°, 43.91°, 45.78°, 49.21°, 66.76°, and 75.73° two theta which correspond to the d-spacings of 2.86 Å, 2.73 Å, 2.68 Å, 2.28 Å, 2.06 Å, 1.97 Å, 1.85 Å, 1.39 Å and 1.25 Å for $\delta Ni_2Si$.

It is well documented that for Ni contacts on SiC, the SiC dissociates due to the strong reactivity of nickel above 400° C. and that at approximately 950° C. the $Ni_2Si$ stable phase is formed. This leads to carbon accumulation both at the interface and within the metal layer.

Figure 5:
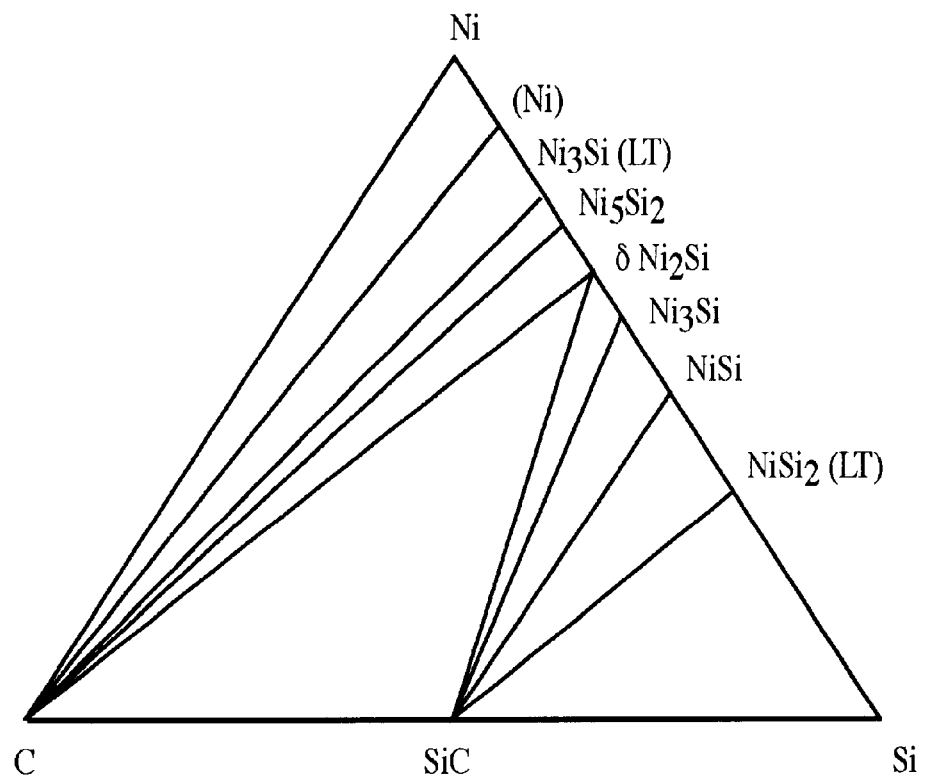
FIG. 5 shows an isothermal section of the Ni—SiC—C ternary phase diagram at 850° C.

Furthermore, the 850° C. isothermal section of the Ni—SiC—C ternary phase diagram, as shown in FIG. 5, is characterized by the absence of Ni—C compounds and therefore determined by the nickel-silicide, $\delta Ni_2Si$ (orthorhombic phase), which is in equilibrium with both, C and SiC. In this ternary phase diagram, no tie line Ni—SiC exists. Therefore, Ni is not in thermodynamic equilbrium with SiC. Thus, the AES profile data, GAXRD results, and the high temperature Ni—SiC phase equilibria, demonstrate the existence of the Ni—Si reaction product, $Ni_2Si$, spatially adjacent to the SiC substrate.

The AES depth profile for the 1000° C. annealed composite contact indicates that both the WSi and the Ti layers served to confine the residual carbon which was released from the dissociation of the SiC during the annealing process. These W—C and Ti—C reactions form the $W_{1-x}C_x$—$Ti_{1-x}C_x$ layer shown and discussed in FIG. 3(b) above, are extremely desirable from the standpoint of device reliability. Carbon inclusions at the metal-SiC interface and within the $Ni_2Si$ contact layer are considered a potential source of electrical instability, especially after prolonged operation of the devices at high temperatures. At elevated temperatures, redistribution of carbon inclusions will arise, resulting in significant degradation of the contact's electrical and microstructural properties. Thus the WSi and Ti layers serve to mitigate carbon segregation at the metal-SiC interface.

Carbon inclusions and segregation are not the only causes of high power and temperature reliability. The microstructure of the contact-SiC interface and nature of the contact surface both strongly influence device operational reliability. Annealing the Ni contacts on SiC causes extensive voidformation, known as Kirkendall voids, at the original metal-SiC interface. Annealing the Ni contacts on SiC also substantially expands contact thickness and increases the surface roughness.

Figure 6A:
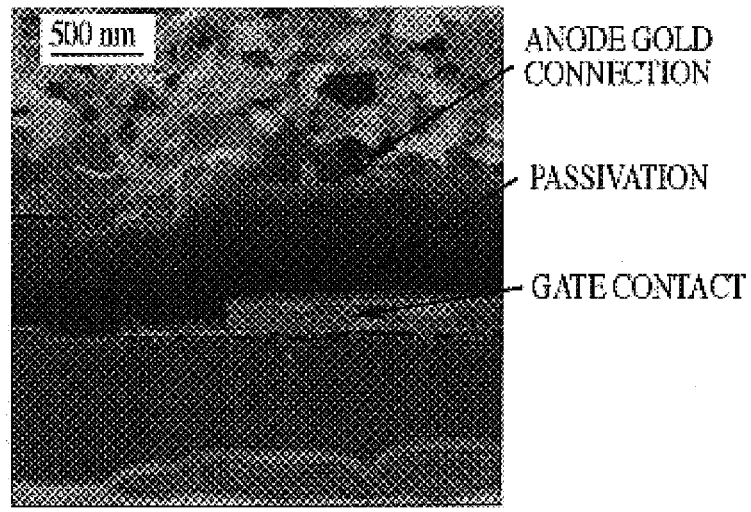
FIG. 6(a) shows a Ni contact to n-SiC micrograph of the gate contact.
Figure 6B:
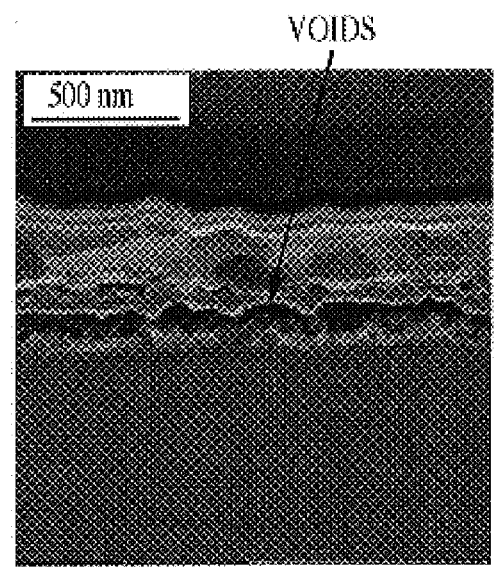
FIG. 6(b) shows an enlargement of the gate contact showing interfacial voiding and roughness.

FIGS. 6(a) and 6(b) show a cross-sectional image of a Ni—SiC Ohmic contact which clearly illustrates the heavily voided rough interface morphology and extreme contact surface roughness (on the order of nanometers) of the Ni—SiC Ohmic contact after annealing at 950° C. The voids at the interface cause internal stress and contact delamination which will compromise device reliability. Under extreme thermal and electrical stresses, the stress and delamination are significantly amplified, leading to device failure. For device applications, Ohmic contacts must be wire bonded to a die package. A rough surface morphology, as shown in FIGS. 6(a) and 6(b), will most likely cause wire bonding difficulty or failure under the extreme thermal fatigue during high power and high temperature device operation.

Figure 7A:
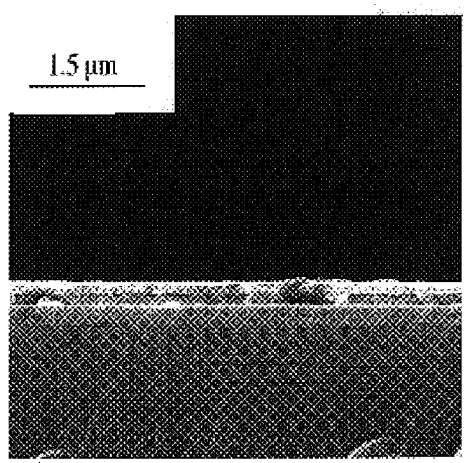
FIG. 7(a) shows a cross-sectional secondary electron field emission SEM micrograph of the as-deposited Pt/Ti/WSi/Ni Ohmic contact to n-SiC.
Figure 7B:
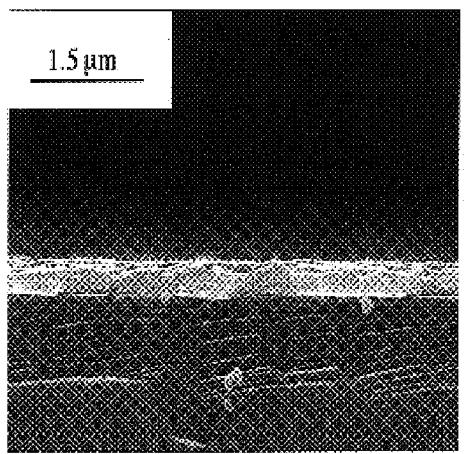
FIG. 7(b) shows a cross-sectional secondary electron field emission SEM micrograph of the 900° C. annealed Pt/Ti/WSi/Ni Ohmic contact to n-SiC.
Figure 7C:
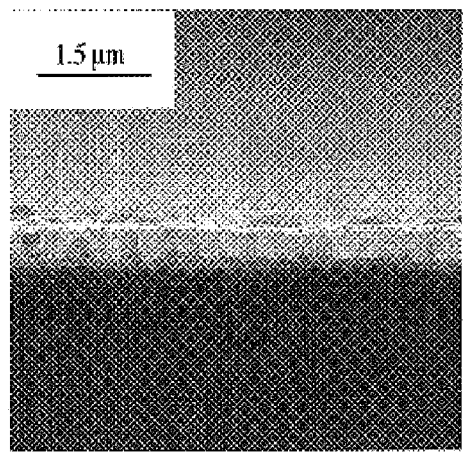
FIG. 7(c) shows a cross-sectional secondary electron field emission SEM micrograph of the 950° C. annealed Pt/Ti/WSi/Ni Ohmic contact to n-SiC.
Figure 7D:
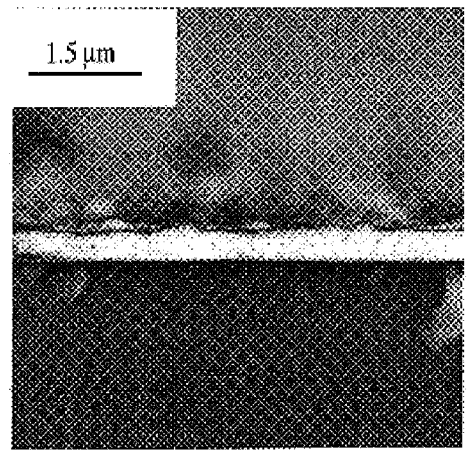
FIG. 7(d) shows a cross-sectional secondary electron field emission SEM micrograph of the 1000° C. annealed Pt/Ti/WSi/Ni Ohmic contact to n-SiC.

FIGS. 7(a) through 7(d) show the FESEM secondary electron cross-sectional images of the as-deposited and annealed contacts to SiC. The metal-SiC interfaces are morphologically abrupt, and as shown in FIG. 7(a), there is no evidence of void formation or contact delamination, as deposited. FIGS. 7(b) through 7(d) show that this phenomena continues for the annealing process up to 1000° C. and that there is no void formation or contact delamination, as a result of annealing, at 900° C. (FIG. 7(b)), 950° C. (FIG. 7(c)); and at 1000° C. (FIG. 7(d)).

Figure 8A:
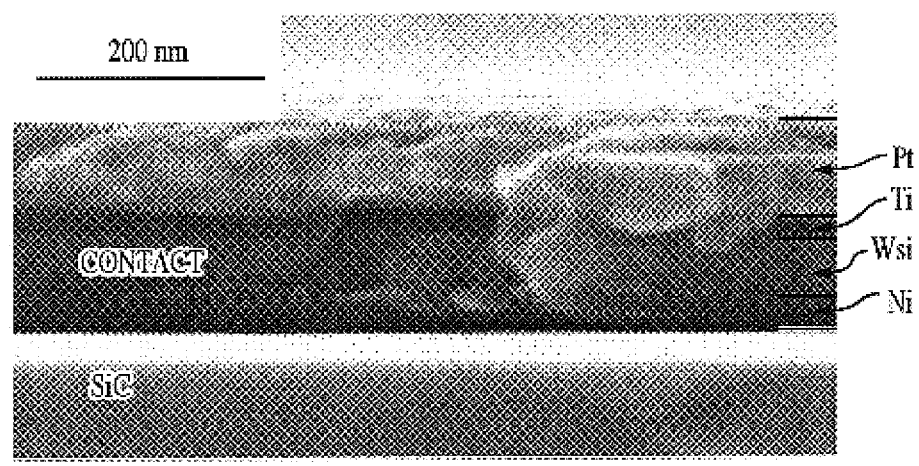
FIG. 8(a) shows a high magnification field emission SEM micrograph of the as-deposited Pt/Ti/WSi/Ni Ohmic contact to n-SiC.
Figure 8B:
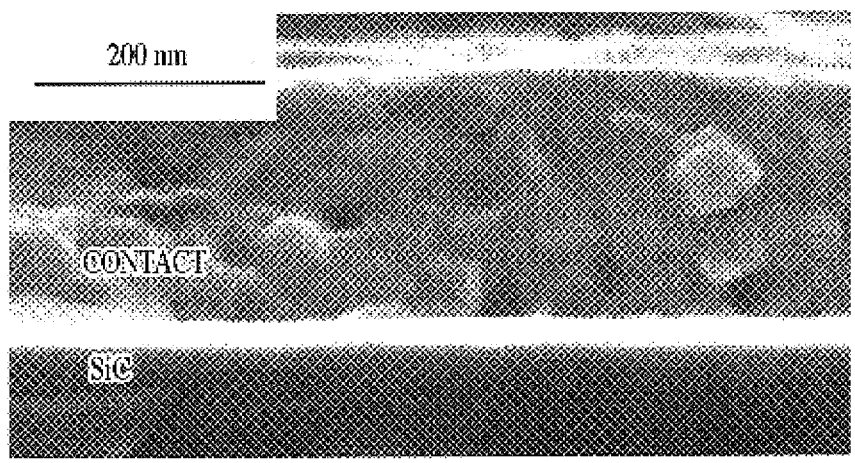
FIG. 8(b) shows a high magnification field emission SEM micrograph of the 1000° C. annealed Pt/Ti/WSi/Ni Ohmic contact to n-SiC.

FIGS. 8(a) and 8(b) show high magnification secondary electron images of the as-deposited and 1000° C. annealed contacts, respectively. The distinct metal layers in the as-deposited contact are noted in FIG. 8(a). FIG. 8(b) shows limited contact growth at 1000° C. Suppressed contact expansion during annealing is due to restricted interfacial contact growth, ie, a narrow Ni—SiC reaction zone. Specifically, depositing a thin Ni layer of approximately 40 nm, as opposed to the standard 100 to 200 nm of Ni significantly limited the Ni—SiC reaction zone. This mitigated contact growth after heat treatment makes the Pt/Ti/WSi/Ni composite contact an excellent choice for device designs which possess shallow p-n junctions. This comparison of the as-deposited and 1000° C. annealed FESEM images in FIGS. 8(a) and 8(b) not only confirms the abrupt void free interface morphology but also reveals that there is minimal increase, <6%, in contact thickness, as a result of annealing.

Figure 9A:
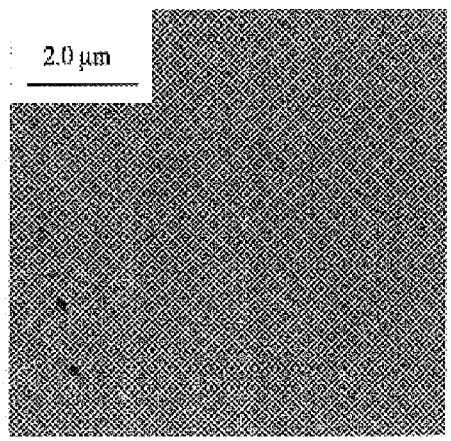
FIG. 9(a) shows a plan-view field emission SEM micrograph of the as-deposited Pt/Ti/WSi/Ni Ohmic contacts to n-SiC.
Figure 9B:
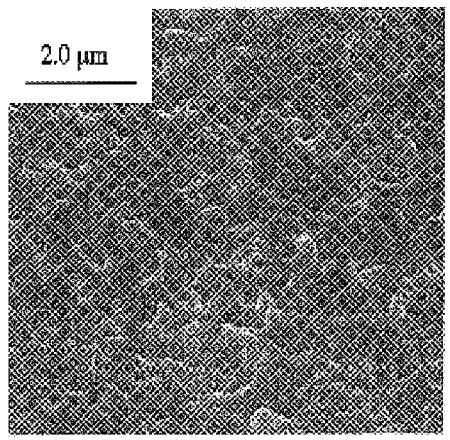
FIG. 9(b) shows a plan-view field emission SEM micrograph of the 900° C. annealed Pt/Ti/WSi/Ni Ohmic contacts to n-SiC.
Figure 9C:
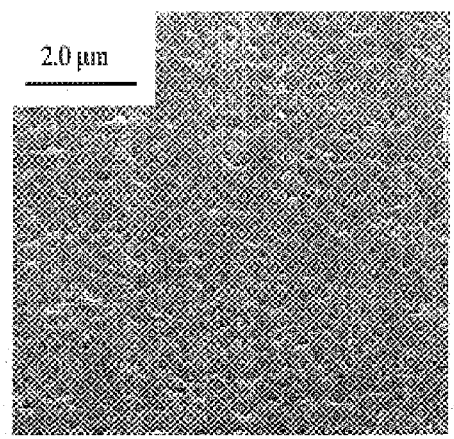
FIG. 9(c) shows a plan-view field emission SEM micrograph of the 950° C. annealed Pt/Ti/WSi/Ni Ohmic contact to n-SIC.
Figure 9D:
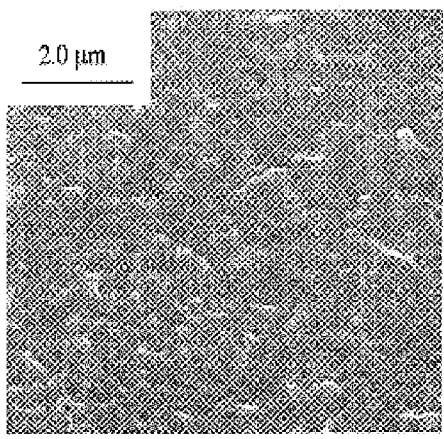
FIG. 9(d) shows a plan-view field emission SEM micrograph of the 1000° C. annealed Pt/Ti/WSi/Ni Ohmic contact to n-SiC.

Plan-view FESEM micrographs of the as-deposited and annealed contacts are presented in FIGS. 9(a) through 9(d). The as-deposited Pt layer, shown if FIG. 9(a), is homogenous and smooth. As shown in FIGS. 9(b) through 9(d), the annealed surfaces remain smooth and show grain growth at 900° C. (FIG. 9(b)), at 950° C. (FIG. 9(c)), and at 1000° C. (FIG. 9(d)).

Figure 10:
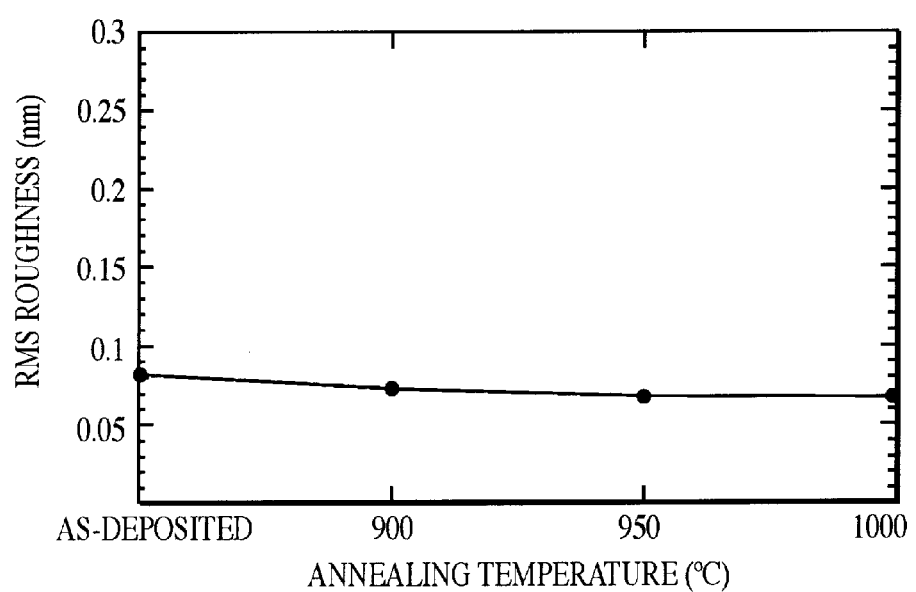
FIG. 10 shows AFM data of the Pt/Ti/WSI/Ni contact as a function of annealing temperature.

FIG. 10 shows an AFM plot of root mean square surface roughness ($R_{RMS}$) as a function of annealing temperature, which provides quantitative analysis of surface roughness. Here, the extreme smoothness of the as-deposited contact surface is substantiated by a $R_{RMS}$ surface roughness value of 0.079 nm. This value remains essentially constant throughout all the heat treatments. Thus, the surface morphology of the annealed Pt/Ti/WSi/Ni composite contact possesses the atomic scale smoothness required for strong reliable wire bonding and maintains excellent wire-contact mechanical durability during high power and high temperature device operation.

To evaluate the high temperature (950 to 1000° C.) post-deposition annealed Pt/Ti/WSi/Ni Ohmic contact to n-SiC for pulsed high power applications, the high temperature annealed composite Ohmic contact was exposed to pulsed thermal stability tests. The stability tests were conducted using a AG Associates RTA where the Ohmic contact was exposed to 1,10, 100 cycle(s) of thermal pulses at a temperature of 650° C. Each thermal pulse interval was 10 s and each pulse was followed by a 60 s cooling interval. The contacts were evaluated via I-V measurements before and after thermal cycling.

Figure 11A:
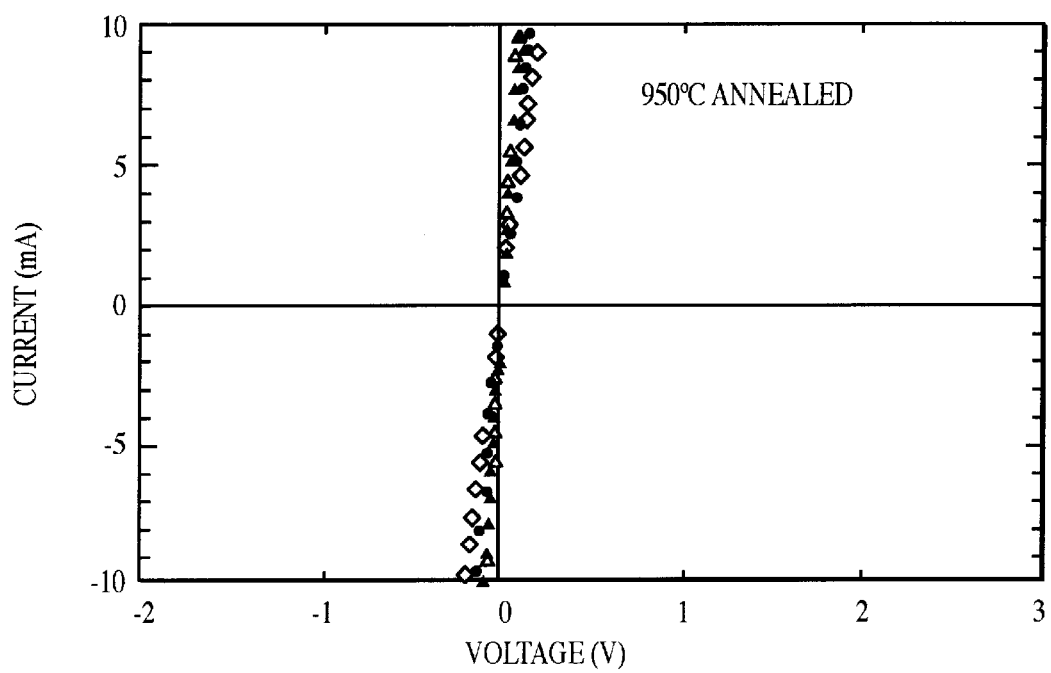
FIG. 11(a) shows I-V characteristics of the 950° C. annealed Pt/Ti/WSi/Ni Ohmic contact, at 650° C., as a function of pulsed thermal stability.
Figure 11B:
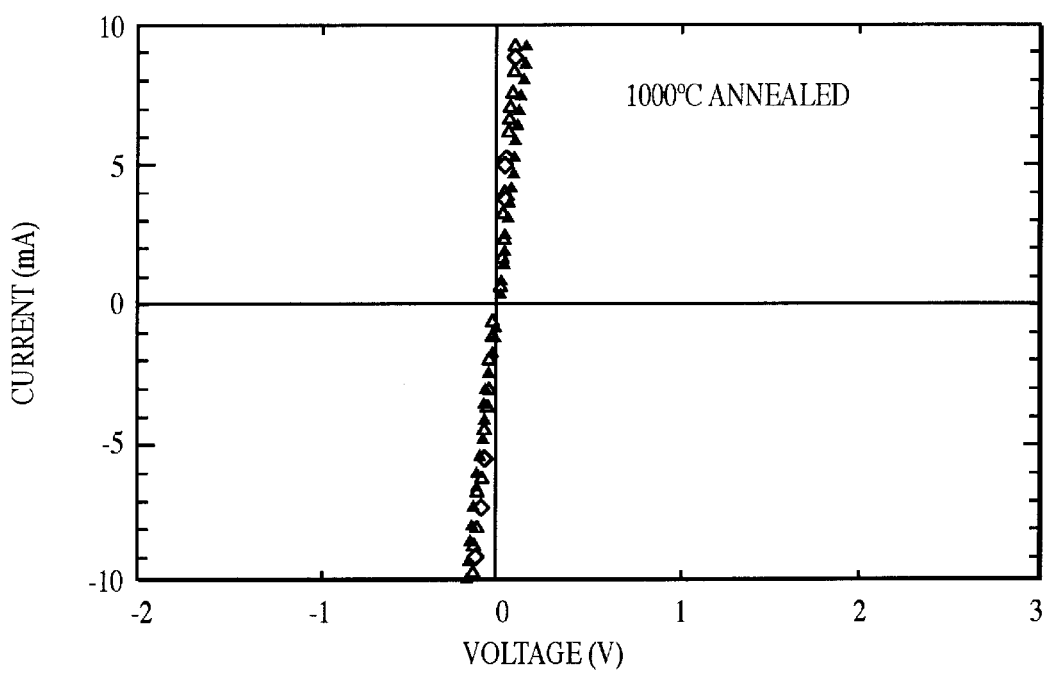
FIG. 11(b) shows I-V characteristics of the 1000° C. annealed Pt/Ti/WSi/Ni Ohmic contacts, at 650° C., as a function of pulsed thermal stability.

FIGS. 11(a) and 11(b) show the I-V characteristics for the 950° C. and 1000° C. annealed Pt/Ti/WSi/Ni Ohmic contacts, respectively. As shown in FIG. 11(a), the I-V characteristics of the 950° C. annealed Pt/Ti/WSi/Ni Ohmic contact, prior to thermal stressing, (represented by open diamond symbols in the graph) exhibits excellent Ohmic behavior. The I-V characteristics of the pulsed thermally stressed contacts show very little deviation from that of the pre-stressed Ohmic characteristics, to 1 cycle of pulsed static fatigue at 650° C. (filled circles), to 10 cycles of pulsed static fatigue at 650° C. (open triangles) and to 100 cycles of pulsed static fatigue at 650° C. (filled triangles). Similarly, FIG. 11(b) shows the I-V characteristics of the 1000° C. annealed Pt/Ti/WSi/Ni Ohmic contact, prior to thermal stressing ( open diamonds) also exhibits excellent Ohmic behavior. The I-V characteristics of the pulsed thermally stressed contacts show very little deviation from that of the pre-stressed Ohmic characteristics to 1 cycle of pulsed static fatigue at 650° C. (filled circles), to 10 cycles of pulsed static fatigue at 650° C. (open triangles), to 100 cycles of pulsed static fatigue at 650° C. These results demonstrate that the high temperature annealed composite Pt/Ti/WSi/Ni Ohmic contact is suitable for pulsed power device applications. and 1000° C.

In order to evaluate the high temperature post-deposition annealed Pt/Ti/WSi/Ni Ohmic contact to n-SiC for high power and high temperature applications, the high temperature post-deposition annealed composite Ohmic contact was exposed to long-term static stability tests. The static thermal stability tests were conducted in a tube furnace at a temperature of 650° C. in a flowing $N_2$ ambient for time intervals of 1 hr., 24 hrs., 50 hrs., 75 hrs., and 100 hrs. The contacts were evaluated via I-V measurements before and after static thermal stability testing.

Figure 12A:
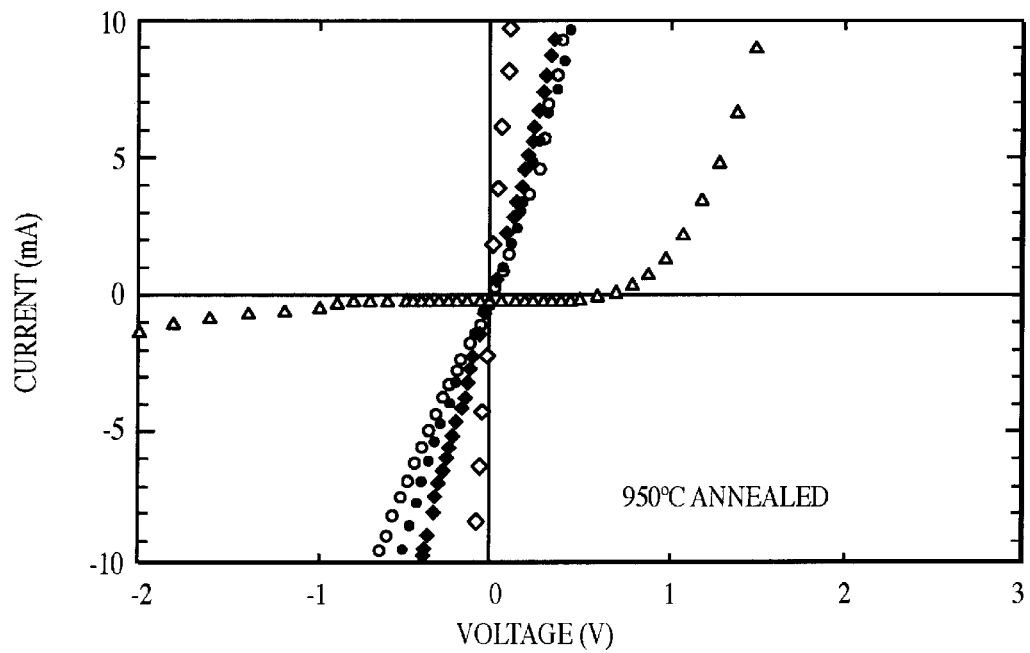
FIG. 12(a) shows I-V characteristics of the 950° C. Pt/Ti/WSi/Ni Ohmic contact, at 650° C., as a function of static thermal stability testing over time.
Figure 12B:
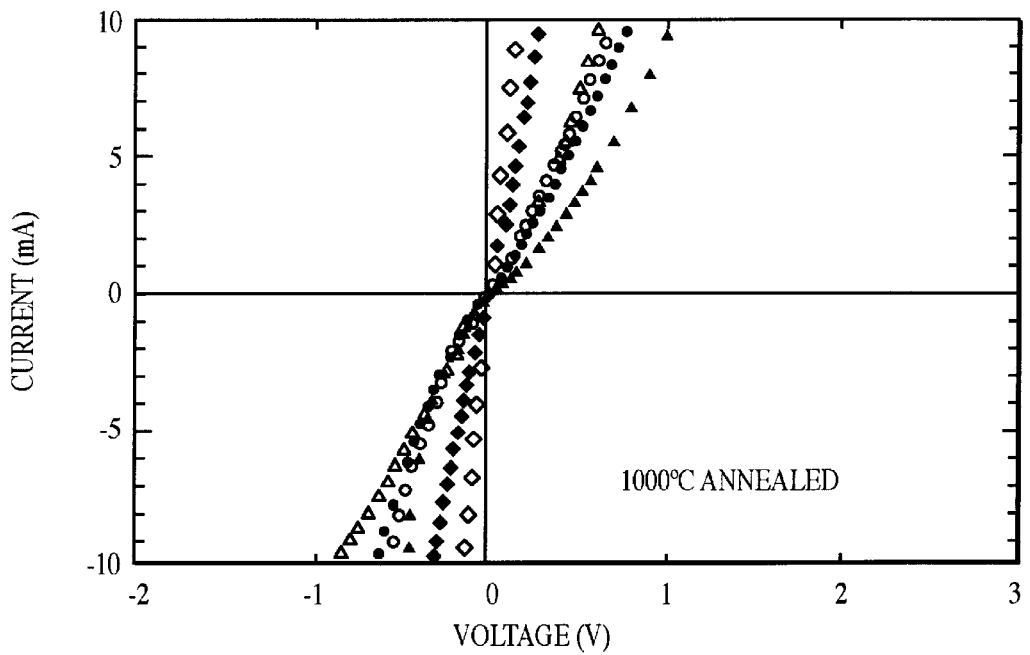
FIG. 12(b) shows I-V characteristics of the 1000° C. Pt/Ti/WSi/Ni Ohmic contact, at 650° C., as a function of static thermal stability testing over time.

FIGS. 12(a) and 12(b) show the I-V characteristics for the 950° C. and 1000° C. annealed Pt/Ti/WSi/Ni Ohmic contacts, respectively. The I-V characteristics of the 950° C. and 1000° C. annealed Pt/Ti/WSi/Ni Ohmic contacts (prior to thermal stressing) shows excellent Ohmic behavior. FIG. 12(a) shows that the electrical integrity of the 650° C. static thermally fatigued contacts exhibits very good I-V characteristics (for the 950° C. annealed Pt/Ti/WSi/Ni Ohmic contact) at 1 hr (filled diamonds), at 24 hrs (open circles), at 75 hrs (filled circles) and at 75 hrs (open triangles). Similarly, FIG. 12(b) shows that the electrical integrity of the 650° C. static thermally fatigued contacts exhibits very good I-V characteristics (for the 1000° C. annealed Pt/Ti/WSi/Ni Ohmic contact) at 1 hr (filled diamonds), at 24 hrs (open circles), at 50 hrs (filled circles) and at 75 hrs (open triangles).

What is claimed is:

1. A composite Ohmic contact comprising
    a base layer having a contact metal layer positioned thereon, a first carbide former layer positioned upon said contact metal layer, a second carbide former layer positioned on said first carbide former layer, and a bond layer position upon said second carbide former layer;
    said base layer, said contact metal layer, said first and second carbide former layer and said bond layer constructed so as to form an multilayer Ohmic contact.

2. A composite Ohmic contact recited in claim 1 further comprising said base layer being n-type silicon carbide(n-SiC), said contact metal layer is nickel (Ni), said first carbide former layer is tungsten silicide(WSi), said second carbide former layer is titanium(Ti) and said bond layer is platinum (Pt).

3. A composite Ohmic contact as recited in claim 1 further comprising said Ni layer being 40 nm thick, said WSi layer is 80 nm thick, said Ti layer is 25 nm thick and said Pt layer is 100 nm thick.

4. A composite Ohmic contact as recited in claim 3 and further comprising said multilayer Ohmic contact constructed so as to be annealed at temperatures between 950° C. and 1000° C.;
    said annealed multilayer Ohmic contact constructed so as to have a low resistance and thermal stability; and
    said annealed multilayer Ohmic contact further constructed so as to operate under high power and high temperatures.

5. A composite Ohmic contact as recited in claim 4 and further comprising a post annealed $Ni_2Si$ intermetallic layer spatially overlying said n-SiC layer, said $Ni_2Si$ layer further constructed so as to form a conductive phase for low resistance and high thermal stability.

6. A composite Ohmic contact as recited in claim 5 and further comprising a post annealed $W_{1-x}C_x$—$Ti_{1-}C_x$ layer, said layer further constructed so as to prevent carbon segregation at an interface of said multilayer contact.

* * * * *